May 3, 1966 T. C. NEW ETAL 3,249,831
SEMICONDUCTOR CONTROLLED RECTIFIERS WITH A P-H JUNCTION HAVING
A SHALLOW IMPURITY CONCENTRATION GRADIENT
Filed Jan. 4, 1963

United States Patent Office 3,249,831

Patented May 3, 1966

3,249,831

SEMICONDUCTOR CONTROLLED RECTIFIERS WITH A P-N JUNCTION HAVING A SHALLOW IMPURITY CONCENTRATION GRADIENT

Thorndike C. New, Hempfield Township, Westmoreland County, Pa., and Robert W. Dolan, deceased, late of Forest Hills, Pa., by Bernard J. Ambrose, administrator, Monroeville, Pa., assignors to Westinghouse Electric Corporation, Pittsburgh, Pa., a corporation of Pennsylvania Filed Jan. 4, 1963, Ser. No. 249,530

4 Claims. (Cl. 317—235)

This invention relates generally to semiconductor controlled rectifiers and their fabrication and, particularly, to such devices with a p-n collector junction having a shallow impurity concentration gradient.

It is a problem with some semiconductor devices to obtain a p-n junction with a shallow impurity concentration gradient. The impurity concentration gradient is the change in impurity concentration at different distances from the junction. A shallow impurity concentration gradient is one which is very gradual and does not exhibit abrupt changes. Semiconductor controlled rectifiers are one type of device in which it is desirable to have a junction with a shallow impurity concentration gradient so that the device will have a high breakover voltage. The present invention will be particularly described as applied to semiconductor controlled rectifiers, although it is to be understood that the present invention may be applied to other devices in which a shallow impurity concentration gradient is desired.

A semiconductor control rectifier is a device generally comprising for successive regions of alternate semiconductivity type material. The regions, in sequence, are herein referred to as the cathode-emitter (or cathode), the first base, the second base and the anode-emitter (or anode). Terminals are provided on the cathode, anode and first base regions. A load circuit connected across the cathode and anode can be controllably energized by a control signal applied to the terminal on the first base region, which terminal is referred to as the gate.

Controlled rectifiers have a well known I–V characteristic in at least one quadrant including a low conductivity or high resistance portion and a portion of very low resistance and hyperconductivity with a transition region of negative resistance therebetween. A sufficient voltage applied across the anode and cathode can produce breakover, that is, switching from the high resistance to the hyperconductive state, without the application of any control signal to the gate. This voltage is referred to as the breakover voltage of the device. It is generally desirable that the breakover voltage be relatively high so that the device does not switch merely due to the voltage across it applied by the load circuit. It is preferred that the device become conductive at most voltage levels only upon application of a signal to the gate.

It has been found that the breakover voltage of the device is higher if the collector junction between the first base region and the second base region has a shallow impurity concentration gradient, that is, if the impurity concentration in the first base region decreases only gradually as one approaches the collector junction. It is believed unnecessary to relate the physical explanation for this relationship between the impurity concentration gradient and the breakover voltage since it has been widely discussed in the literature such as Veloric et al., "Avalanche Breakdown Voltage in Silicon Diffused p-n Junctions as a Function of Impurity Gradient," J. App. Phys., v. 227, p. 895–899, August 1956.

As controlled rectifiers have been previously fabricated, an n-type substrate is diffused with a single p-type impurity to form a layer which is subsequently divided into two physically separate portions to provide the first base region and the anode disposed on the opposite sides of the second base region which is provided by the starting material. An n-type cathode is formed on the surface of the first base region, generally by alloy fusion but it may also be formed by diffusion of an n-type impurity. In this general process it is the diffusion operation by which the first base region is formed that is of primary interest for improving the breakover voltage of the device.

A relatively shallow impurity concentration gradient generally results from a long, deep diffusion. However, long processing times are highly undesirable and, furthermore, the surface concentration of the diffused region must be controlled for satisfactory device operation as has been also discussed in the literature. The prior method of fabrication employing a single p-type impurity, such as gallium, for the diffusion of the first base region is necessarily a compromise between these various factors in order to provide a satisfactory device at lowest cost possible.

Presently the resistivity of the starting material is in a range of from about 1 to about 50-ohm-centimeters. If the resistivity were increased, a shallow impurity concentration gradient could be more readily provided. However, the higher resistivity of the starting material increases the voltage drop when the device is in the conductive state and is hence undesirable. The surface concentration of the diffused first base region must be sufficiently high so that the amplification factor (alpha) of the first three region transistor equivalent is low enough so that it will not cause the device to fire at only moderately high temperature. Preferably the device should not be temperature dependent in its firing characteristic. On the other hand, too high a surface concentration of the first base region will make firing difficult under any conditions and for that reason, the impurity concentration of the surface should be of the order of $10^{17}$ to $10^{18}$ atoms/cc. and not appreciably more nor less.

It is, therefore, an object of the present invention to provide improved semiconductor devices having shallow impurity concentration gradients.

It is another object to provide improved semiconductor controlled rectifiers which exhibit a high breakover voltage without deterioration of other characteristics.

Another object is to provide methods for the fabrication of semiconductor devices and particularly for semiconductive controlled rectifiers with a region having a shallow impurity concentration gradient and a carefully controlled surface concentration.

The invention, in brief, is directed to a method of fabricating a semiconductor device to provide a p-n junction with a shallow impurity concentration gradient wherein a diffusion is performed of at least two impurities of the same type, one of which impurities penetrates to the desired junction depth and provides a shallow gradient at the junction and a second of which impurities penetrates to a lesser depth and provides a desired high surface concentration. The invention is further directed to semiconductor devices, particularly controlled rectifiers, which have a region with two impurities penetrating to different depths and which can be provided by the foregoing method. It is also a feature of the present invention to provide diffusion sources for carrying out the foregoing method whereby the two impurities to be diffused are contained in the same source.

The features of the present invention, together with the above mentioned and other objects and advantages thereof, may best be understood by reference to the following description, taken in connection with the accompanying drawings, in which.

Figure 1:
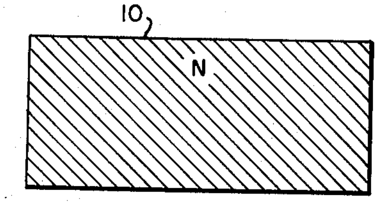
FIGURES 1 through 4 are cross-sectional views of a semiconductor controlled rectifier in accordance with the present invention at different stages in the fabrication process.

Referring to FIG. 1, there is shown, in cross-section, a semiconductor wafer 10 which, for purposes of an example, has been selected of n-type semiconductivity.

Figure 2:
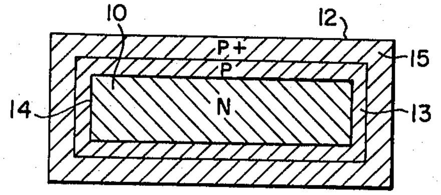

Referring to FIG. 2, the starting wafer 10 is shown after it has been diffused with impurities in accordance with the present invention. The diffused layer 12 comprises an inner portion 13 which forms a p-n junction 14 with the starting material and an outer portion 15 of the same type of semiconductivity as the inner portion 13 but having a higher impurity concentration and therefore designated p+ type while the inner portion 13 is designated p-type.

Figure 3:
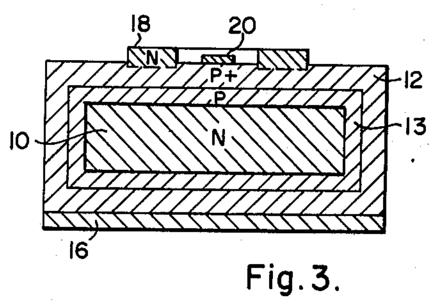
Figure 4:
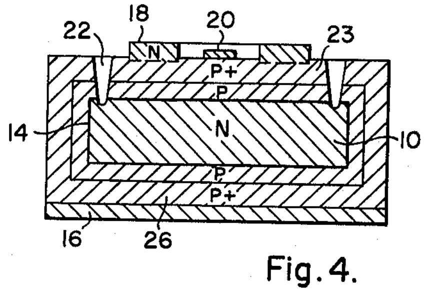

To complete the example of the practice of the present invention, in FIGS. 3 and 4 subsequent stages of processing are shown. In FIG. 3, the diffused wafer 10 of FIG. 2 is shown with an ohmic contact 16 on the lower surface, an annular n-type region 18 on the upper surface, which may be formed, for example, by alloy fusion so that an ohmic contact is also provided on the n-type region, and a second ohmic contact 20 on the diffused layer 12. In FIG. 4, the structure shown in FIG. 3 is shown with a groove 22 separating the diffused layers 13 and 15 into two physically distinct portions. The groove may be a circular one which surrounds the annular n-type region 18. Alternatively, an equivalent method is to remove material around the periphery of the device to separate the junctions.

It will be recognized that the device shown in FIG. 4 may be utilized as a controlled rectifier after the attachment of leads an encapsulation, which may be conventional. The device is essentially of four semiconductive regions of alternate semiconductivity type with p-n junctions therebetween. The first n-type region 18 on the upper surface serves as the cathode emitter. The portion of the diffused layer, including both the p and p+ portions 13 and 15, adjacent the cathode serves as the first base region 23 and the contact 20 thereto as the gate terminal. The original starting n-type material 10 serves as the second base region. The portion of the diffused layers 13 and 15 adjacent the lower surface of the device serves as the anode emitter 26.

The device of FIG. 4 is suitable for all of the well known controlled rectifier applications and is particularly advantageous in those applications where it is desired to have a high breakover voltage and high operating temperature. The high breakover voltage is achieved by the first base region 23 having a graded impurity doping concentration. In this way, it is possible to achieve the depth of penetration of the junction 14 to provide a shallow impurity concentration gradient at the junction and at the same time to provide the desired surface concentration which should be relatively high but at a controlled value. This is achieved by performing diffusion with two impurities of the same type, here acceptor type impurities, one of which penetrates within the starting wafer to form a p-n junction of desired depth and a second of the impurities penetrating to less than the depth of the first impurity and providing the desired surface concentration.

Figure 5:
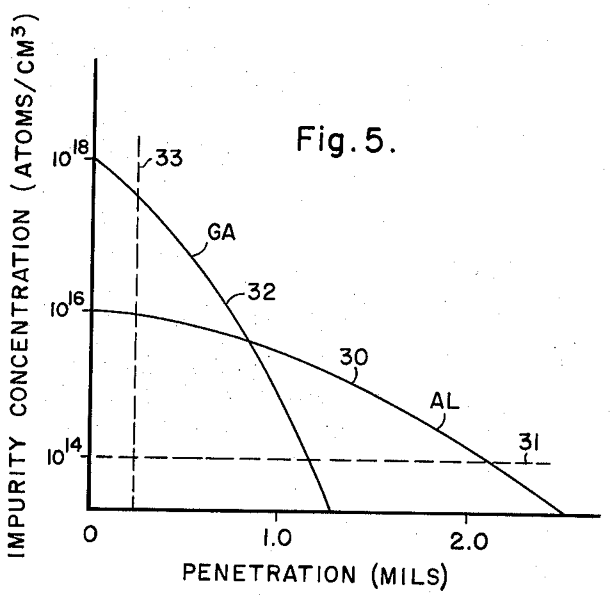
FIGURE 5 is a graph of impurity concentration against depth of penetration for a typical device in accordance with the present invention.

The graded resistivity of the first base region may be better understood with reference to FIG. 5 which shows how the impurity concentration varies through the first base region 23. It will be understood, that this is merely an example of the present invention. The diffusion profile of a first impurity, in this case aluminum, is shown on the first curve 30. The aluminum concentration is about $10^{16}$ atoms/cc. at the surface and diminishes to less than about $10^{14}$ atoms/cc. at a distance of about 2½ mils within the material. The horizontal dotted line 31 shows the level of impurity concentration in the starting wafer is about $10^{14}$ atoms/cc. Therefore, the aluminum diffusion causes a p-n junction to be formed at a depth of slightly greater than 2 mils. Since aluminum is a relatively fast diffusant, it penetrates deeply and forms a shallow impurity concentration gradient at the junction. That is, the slope of the aluminum diffusion profile at the junction is relatively low which is desirable for a high breakover voltage. Unfortunately, the achievement of such a shallow impurity concentration gradient at the junction and the desired surface concentration, as discussed in the introductory material, is generally inconsistent with a single doping impurity. It has been found that the surface concentration of aluminum is limited to the order of $10^{16}$ atoms/cc. which is too low for desired controlled rectifier characteristics. It is not well understood the reason for the limit on the aluminum surface concentration but it is believed that it may be due to the presence of a surface layer on the semiconductor which interferes with the diffusion of additional aluminum into the bulk material.

The second curve 32 shows the diffusion profile of a second impurity, which in this case is gallium. The gallium diffusion profile shows a surface concentration of about $10^{18}$ atoms/cc. which falls off relatively abruptly and does not reach the depth of the junction formed by the aluminum diffusion. The achievement of the desired surface concentration with gallium, as contrasted with aluminum, may be done in a relatively short time. If gallium were used alone to form the p-n junction and to achieve the desired surface concentration, several disadvantages would be encountered. To achieve a shallow impurity concentration gradient at the junction with gallium would require a very long and slow diffusion which would be undesirable economically. Furthermore, gallium does not provide as low a leakage current across the junction as is desired. Furthermore, to get the depth of penetration necessary for a shallow impurity concentration at the junction with gallium, it is very difficult to control the surface concentration so that it does not exceed the desired amount which is of the order of $10^{18}$ atoms/cc. To perform gallium diffusion to achieve the desired junction characteristic and surface concentration within a reasonable time would require very high temperatures which would possibly damage the semiconductive material and would make it practically impossible to perform the diffusion within a conventional type of evacuated quartz tube.

The vertical dotted line 33 indicates the depth at which the emitter junction is formed by alloy fusion. This depth is readily determined by the alloy foil thickness and is chosen so that the doping level at the junction is in the range from about $6\times10^{16}$ atoms per cubic centimeter to about $3\times10^{17}$ atoms per cubic centimeter.

It is therefore seen that the present invention provides a solution to these problems by the diffusion of two impurities of the same type into the substrate. This improvement may be readily practiced without departing radically from conventional controlled rectifier fabrication techniques since it requires modification only of the diffusion operation performed on the starting wafer. In addition to the improvement in breakover voltage which is achieved by reason of the shallow impurity concentration in the first base region 23, it has also been found that the reverse voltage which the device is capable of sustaining is also increased.

The graded resistivity of the diffused region in the anode region 26 with a highly doped p+ layer 15 provides the advantage of increasing the efficiency of the anode emitter while the device is in the hyperconductive state.

Figure 6:
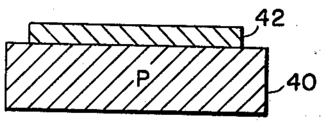
FIGURE 6 is a cross-sectional view of a diffusion source in accordance with the present invention.

It has been found that as a source for the diffusion of two impurities of the same type, the two impurities may be intimately mixed or alloyed together on a suitable substrate with the relative amounts of the two impurities being determined in accordance with the desired graded resistivity to be produced. For example, alloyed compositions of gallium and aluminum with from about 0.5% by weight to about 50% by weight of gallium will provide the desired range of surface concentration and penetration in silicon. The gallium-aluminum alloy can be prepared by placing weighed amounts of the materials on a p-type silicon body and fusing to form the alloy in a vacuum. The diffusion source would be used in a conventional manner such as by placing it in the evacuated quartz tube in which the silicon slices are contained for diffusion. In FIG. 6 is shown such a source including a doped semiconductor substrate 40, here p-type silicon, with the alloyed impurities 42, such as gallium and aluminum thereon.

The method of the present invention may be performed using n-type silicon having a resistivity of from about 1 ohm-centimeter to about 50 ohm-centimeters as the starting material with aluminum as one impurity diffused to a depth of from about .001 inch to about .005 inch with a surface concentration of the order of $10^{16}$ atoms/cc. and with gallium as the other impurity diffused to a depth of from about .0002 inch to about .002 inch to provide a total acceptor-type impurity surface concentration of from about $10^{17}$ to about $10^{19}$ atoms/cc.

In one typical example of the practice of the present invention, several n-type silicon slices to be used as the starting material were obtained. The silicon slices were degreased in trichloro-ethylene and rinsed in methanol using an ultrasonic cleaner. The resistivity and thickness of the slices were then checked and found to be a resistivity of from about 10 to about 50 ohm-centimeters (of the order of $10^{14}$ atoms/cc. impurity concentration) and a thickness of about 12 mils. After cleaning, the silicon slices were etched in an etchant of two parts by volume $HNO_3$, one part by volume HF and one part by volume $CH_3COOH$, and then dried and placed in a clean quartz tube.

A diffusion source was prepared of an alloy with 7 weight percent of gallium and the balance aluminum on a p-type silicon slice with a thickness of about 60 mils with the alloy fused under a vacuum of $10^{-6}$ millimeters of mercury. The diffusion source was also placed in the quartz tube with the silicon slices. The quartz tube containing the diffusion source and the slices was sealed after evacuation to $10^{-7}$ millimeters of mercury and placed in a controlled furnace which was heated to a temperature of about 1230° C. for about 20 hours.

As a result of the foregoing diffusion operation, a diffusion profile substantially like that shown in FIG. 5 resulted. Testing of the devices made showed a breakover voltage of aboct 780 volts at 10 milliamperes leakage current at 150° C. This is an unusually good breakover voltage as compared with conventional devices.

The present invention may be practiced with other combinations of semiconductive materials and impurities, it being preferred that the impurities selected have markedly different diffusion constants, at least different by a factor of two, in the particular substrate used. The following table gives suitable examples of substrate material and impurities, the faster diffusing impurity being given first:

| Substrate | Impurities |
|---|---|
| n-type Si | Al and either Ga or B |
| n-type Si | B and either In or Tl |
| p-type Si | P and either Bi, As or Sb |
| n-type Ge | In and Tl |
| p-type Ge | As and either Bi, Sb or P |
| p-type Ge | Bi and P |
| p-type Ge | Sb and P |
| n-type InAs | Zn and Mg |
| n-type InAs | Cd and Zn |

The particular diffusion parameters employed may be selected by those skilled in the art in accordance with existing knowledge.

While the present invention has been shown and described in certain forms only, it will be obvious to those skilled in the art that it is not so limited but is susceptible to various changes and modifications without departing from the spirit and scope thereof.

We claim as our invention:

1. A semiconductor controlled rectifier comprising: four semiconductive regions of alternate semiconductivity type with p-n junctions therebetween including, in sequence, a first emitter region, a first base region, a second base region and a second emitter region; ohmic contacts on said first emitter, first base and second emitter regions; said first base region having a first portion adjacent the collector junction formed with said second base region and a second portion adjacent the emitter junction formed with said first emitter region, said first portion having a doping impurity concentration which is substantially determined by a first doping impurity and which increases at a gradual rate away from said collector junction, said second portion having a doping impurity concentration which is substantially determined by a second doping impurity and which increases away from said first portion at a greater rate than the impurity concentration of said first doping impurity so that a shallow impurity concentration gradient is provided by said first doping impurity at said junction to achieve a high breakover voltage for the device and a desired doping concentration at the emitter junction is provided by said second doping impurity.

2. A semiconductor controlled rectifier in accordance with claim 1 wherein said semiconductive regions are in a body of silicon and said first and second doping impurities are aluminum and gallium, respectively.

3. A semiconductor controlled rectifier in accordance with claim 1 wherein: said semiconductor regions are in a body of silicon; said second base region has an impurity concentration of the order of $10^{14}$ atoms per cubic centimeter; said first base region has a thickness of from about 2.0 to about 2.5 mils; said first and second doping impurities in said first base region are aluminum and gallium, respectively, with a surface concentration of the order of $10^{17}$ atoms per cubic centimeter to the order of $10^{18}$ atoms per cubic centimeter.

4. A semiconductor controlled rectifier in accordance with claim 1 wherein: said first emitter region and said second base regions are both of n-type semiconductivity and said first base region and said second emitter region are both of p-type semiconductivity.

References Cited by the Examiner

UNITED STATES PATENTS

| | | | |
|---|---|---|---|
| 2,806,983 | 9/1957 | Hall | 317—235 |
| 2,811,653 | 10/1957 | Moore | 307—88.5 |
| 2,862,840 | 12/1958 | Kordalewski | 148—185 |
| 2,936,256 | 5/1960 | Hall | 148—33 |
| 2,959,719 | 11/1960 | Ezaki | 317—235 |
| 2,981,874 | 4/1961 | Rutz | 317—235 |
| 2,993,818 | 7/1961 | Allen et al. | 148—173 |

(Other references on following page)

UNITED STATES PATENTS

| | | | |
|---|---|---|---|
| 3,006,791 | 10/1961 | Webster | 317—235 X |
| 3,025,192 | 3/1962 | Lowe | 148—33 |
| 3,028,655 | 4/1962 | Dacey et al. | 29—25.3 |
| 3,043,725 | 7/1962 | Anderson et al. | |
| 3,065,392 | 11/1962 | Pankove | 317—235 |
| 3,070,466 | 12/1962 | Lyons | 148—1.5 |
| 3,074,826 | 1/1963 | Tummers | 148—1.5 |
| 3,078,195 | 2/1963 | Tummers et al. | 148—185 X |
| 3,079,512 | 2/1963 | Rutz | 317—235 X |
| 3,097,335 | 7/1963 | Schmidt | 317—235 X |
| 3,099,591 | 7/1963 | Shockley | 317—235 X |
| 3,124,862 | 3/1964 | Benjamin | 317—235 X |

FOREIGN PATENTS

| | | |
|---|---|---|
| 780,455 | 7/1957 | Great Britain. |

JOHN W. HUCKERT, *Primary Examiner.*

JAMES D. KALLAM, *Examiner.*

A. M. LESNIAK, C. E. PUGH, *Assistant Examiners.*